United States Patent
Ichinose et al.

(10) Patent No.: US 6,221,685 B1
(45) Date of Patent: Apr. 24, 2001

(54) METHOD OF PRODUCING PHOTOVOLTAIC ELEMENT

(75) Inventors: Hirofumi Ichinose, Tokyo; Tsutomu Murakami; Yukie Ueno, both of Nara, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/203,361

(22) Filed: Dec. 2, 1998

(30) Foreign Application Priority Data

Mar. 12, 1997 (JP) .................................... 9-332544

(51) Int. Cl.$^7$ .................................... H01L 21/00
(52) U.S. Cl. .................... 438/48; 438/49; 204/157.15
(58) Field of Search ................ 438/80, 73, 48, 438/74, 79, 81; 204/157.15, 140

(56) References Cited

U.S. PATENT DOCUMENTS

| | | | |
|---|---|---|---|
| 4,166,918 | 9/1979 | Nostrand et al. | 136/89 R |
| 4,729,970 | 3/1988 | Nath et al. | 437/225 |
| 5,084,400 | 1/1992 | Nath et al. | 437/4 |
| 5,320,723 | * 6/1994 | Kawakami | 204/140 |
| 5,798,284 | * 8/1998 | Nakagawa | 438/80 |
| 5,859,397 | * 1/1999 | Ichinose et al. | 204/157 |

FOREIGN PATENT DOCUMENTS 62-4869   2/1987 (JP) .
62-59901  12/1987 (JP) .

* cited by examiner

*Primary Examiner*—David Nelms
*Assistant Examiner*—Dung A Le
(74) *Attorney, Agent, or Firm*—Fitzpatrick, Cella, Harper & Scinto

(57) ABSTRACT

The present invention provides a method of producing a photovoltaic element, which comprises a step of immersing a photovoltaic element having at least a first electrode layer, a semiconductor layer and a second electrode layer formed on a substrate into an electrolytic solution, and removing a short circuit current path caused by a defect in the photovoltaic element under the effect of an electric field, wherein the amount of a first ingredient and the amount of a second ingredient contained in the electrolytic solution are adjusted to control the concentration of hydrogen ions in the electrolytic solution, wherein the constituent substance of the second electrode layer is electrically dissolved by the first ingredient, and thereby it also provides a method of producing photovoltaic elements which is capable of reducing a leakage current caused by defect portions such as pin-holes existing in the photovoltaic elements with a large area to obtain photovoltaic elements with excellent photovoltage generation characteristics under a low illuminance.

13 Claims, 2 Drawing Sheets

METHOD OF PRODUCING PHOTOVOLTAIC ELEMENT

BACKGROUND OF THE INVENTION

1. Field of the Invention

The present invention relates to a method of producing a photovoltaic element, specifically a method of producing a photovoltaic element having excellent characteristics by removing short-circuit current paths due to defects.

2. Related Background Art

In recent years, with increased area of a photovoltaic element such as a solar cell, a multilayered photovoltaic element comprising a semiconductor film having a large area such as an amorphous silicon film have been developed. To produce photovoltaic elements with a large area, continuous process techniques such as a roll-to-roll technique are attracting attention.

However, it is difficult to produce a photovoltaic element with a multilayered structure which is free from defects over a large area. For example, in the case of photovoltaic elements comprising a plurality of stacked thin films of amorphous silicon or the like, pin-holes and defects caused by the effects of dust in the deposition of semiconductor layers are likely to cause shunts and shorts. These shunts and shorts are well known in significantly degrading the characteristics of photovoltaic elements. Particularly among these characteristics, it is known that photovoltage generation characteristics are significantly deteriorated.

The cause and effect of pin-holes and defects will be described in detail. For example, in the case of an amorphous silicon solar cell formed by depositing amorphous silicon on a stainless-steel substrate, the substrate surface can not be said to be a perfectly smooth and flat plane, but has flaws and hollows, or spike-shaped protrusions. In some cases, an electrode layer with projections and depressions (back reflector) is formed on the stainless-steel substrates to scatter light. Therefore, a large cause of generating defects and pinholes exists in that a thin semiconductor layer having a thickness of a few hundreds Å such as an n-type or p-type layer can not completely coat the above surface. Also, as described above, minute dusts in a deposition process may cause pinholes.

In this way, a semiconductor layer between a first electrode (lower layer) and a second electrode (upper layer) in a solar cell is lost due to pinholes, so that the first electrode and the second electrode directly contact to each other, or spike-shaped defects on a substrate are in contact with the second electrode, or a semiconductor layer is not completely lost but a shunt or a short circuit having a low resistance is formed. In these cases, an electric current generated by light flows in parallel with the second electrode into the shunt portion or the short circuit portion having a low resistance, whereby the generated current is lost. When these current losses exist, the open circuit voltage of a solar cell, that is, the voltage characteristics are significantly reduced. This reduction is more remarkable under low light intensity, and thus becomes a serious problem for a solar cell which is required to generate electricity under any weather conditions.

In the case of the short circuit described above, it is required to take counter-measures for minimizing the current loss caused by the current flowing into the low resistance portion forming the short circuit. For such counter-measures, it is well known to minimize or eliminate the current loss either by directly removing defect portions and pinholes or by removing materials on the periphery of short circuit portions or by changing the materials into electrical insulating materials.

Specifically, U.S. Pat. No. 4,166,918 discloses a method of removing a defect portion in an electrical short circuit portion in a solar cell having a large area, in which the defect portion in the solar cell is baked and removed by applying a sufficiently high reverse bias voltage not more than breakdown voltage. However, the application of a high reverse biased voltage to a solar cell includes the possibility of damage to the normal portion other than the defect portion during baking, and the controlling is difficult.

Further, Japanese Patent Publication No. 62-59901 discloses a method of making up a pinhole in a semiconductor device by using a laser beam. However, this technique requires special application for focusing a laser beam on the pinhole. Further, there is possibility of damage to a normal portion other than pinholes by the laser beam.

Furthermore, Japanese Patent Publication No. 62-4869 discloses a method of filling a pinhole extending through an amorphous film of a photovoltaic element with electrical insulating materials. After the applying a photosensitive insulating material to the film, the pinhole is filled with the insulating material by selectively exposing the pinhole portion to light through an optically transparent substrate. Therefore, this method can not be applied to the cases of an opaque electroconductive substrate and so the range of application is limited.

Still further, U.S. Pat. No. 4,729,970 discloses a method of electrically insulating a short defect portion in an electric device including a transparent electroconductive film from the electrode by bring a conversion reagent into contact with the short defect portion to change the electroconductive film in the vicinity of the defect portion to a high resistant material. Specifically, the method comprises a treatment using a reagent containing a Lewis acid (more definitely, a salt of amphoteric elements), to be precise, chlorides such as $AlCl_3$ and $ZnCl_2$. However, in the cases of the treatment using such a reagent of amphoteric elements, when a photovoltaic element having a multilayered film structure includes an amphoteric metal such as Al, the amphoteric metal is significantly eroded to result in a problem of such a side effect of peeling off during the treatment.

Yet further, U.S. Pat. Nos. 5,084,400 and 5,320,723 discloses a method of electrically insulating a short defect portion in the photovoltaic element deposited on a metal substrate from the electrode, by applying a voltage to the electroconductive film in the vicinity of the short defect portion in an acid solution such as $H_2SO_4$ to change the electroconductive film to a high resistance film. This method has certainly overcome the problem of peeling off with respect to Al as described above by using an acid having sulfate group such as $H_2SO_4$. However, in the cases of photovoltaic element composed of a thin film of such a material as ZnO, as the erosion of ZnO is very sensitive to the concentration of hydrogen ions, the problem of peeling off during the treatment exists.

SUMMARY OF THE INVENTION

An object of the present invention is to overcome the problems as described above and provide a method of producing a photovoltaic element with excellent photovoltage generation characteristics under a low illuminance by reducing a leakage current caused by a defect portion such as a pin-hole in a photovoltaic element with a large area. A further object of the present invention is to provide a method of producing photovoltaic elements having high reliability with high mass-producing ability.

The invention provides a method of producing a photovoltaic element, which comprises a step of immersing a photovoltaic element having at least a first electrode layer, a semiconductor layer and a second electrode layer formed on a substrate into an electrolytic solution, and removing a short-circuit current path caused by a defect in the photovoltaic element under the effect of an electric field, wherein the amount of a first ingredient and the amount of a second ingredient in the electrolytic solution is adjusted to control the concentration of hydrogen ions in the electrolytic solution and the constituent ingredient of the second electrode layer is electrically dissolved by the first ingredient.

BRIEF DESCRIPTION OF DRAWINGS

FIG. 2A shows the apparatus having an external power source and FIG. 2B shows the apparatus provided with a light-irradiation element.

DESCRIPTION OF PREFERRED EMBODIMENTS

Figure 1A:
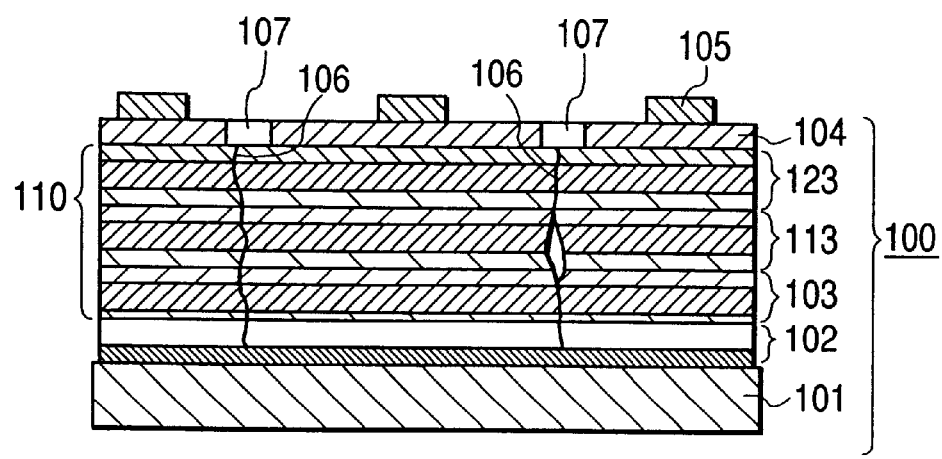
FIGS. 1A and 1B are a cross-sectional view and a plan view, respectively, for showing one example of the photovoltaic element produced according to the present invention.

In order to achieve the above-described objects, the inventors have studied a method of producing a photovoltaic element which enables to reduce a leakage current caused by a defect portion such as a pin-hole in photovoltaic elements and further which enables to perform treatment with long term stability and without a side effect such as peeling off. As a result, the following knowledge has been obtained.

That is, when a photovoltaic element is immersed into an electrolytic solution, and a short-circuit current path caused by defects in the photovoltaic element is removed under the effect of an electric field, the electrolytic solution is prepared such that a concentration of hydrogen ions thereof is adjusted to restrain a first electrode from peeling off, and contains ions as a electrolyte which stably take constituent substances dissolved from the second electrode into the solution such that the constituent substances of the second electrode is prevented from remaining on the surface of the defect portion in the photovoltaic element. As a result, the erosion of the first electrode layer is constrained to generate no peeling off during the electrolytic treatment, and the second electrode layer in the vicinity of the defect such as a pin-hole is reduced to stably dissolve the constituent substance of the second electrode layer into the electrolytic solution, so that the constituent substances of the second electrode do not remain on the surface of the defect portion in the photovoltaic element.

The adjustment of hydrogen ions will be described in more detail. As will be seen later, the first electrode layer preferably comprises a metal layer, an alloy layer or a multilayered body thereof for enhancing the reflection of incident light and increasing photo-generated current. More preferably, the first electrode layer is formed by stacking a layer of metal oxide such as ZnO on a layer of a metal or alloy such as Ag, Al, AlSi or the like. In this case, to increase the amount of reflection, it is important to select a suitable material for the metal layer and a suitable condition for forming the metal film. For example, Ag is often used to increase the amount of reflection, but Ag easily ionizes under the influence of moisture to cause electromigration. So, when the photovoltaic elements using Ag is used outdoors without a complete blockage of moisture, there occurs a problem in long-term reliability. Therefore, it is preferable to use Al or AlSi as a material resistant to moisture. However, there is a problem that the films thereof partially peeling off during acid or alkaline solution treatment depending on the conditions for forming the film when halogen ions, particularly Cl$^-$ ions, exists. As countermeasures against it, it is thought to contrive a film formation temperature and a film formation rate, but it is very difficult to obtain a condition for forming a layer having an increased amount of reflection, enhanced adhesion and high resistance to peeling off. The peeling off as specifically observed at the interface between the metal (alloy) layer and the substrate beneath the metal (alloy) layer or between the metal (alloy) layer and the metal oxide layer (transparent electroconductive oxide layer) placed on the metal (alloy) layer.

As a method of restraining the first electrode layer from peeling off, a method of reducing the concentration of halogen ions, that is, lowering the concentration of the electrolytic solution, and extremely speeding up the treatment rate are considered. However, it is very difficult to restrain the peeling off of the first electrode layer by using a concentration for reducing the second electrode layer. It is also difficult to treat for a sufficient short time in consideration of post-processing such as conveying or cleaning.

When materials not containing halogen ion as an ingredient of the electrolytic solution, for example, strongly acid electrolyte such as sulfuric acid, nitric acid and selenic acid, are used as an ingredient of the electrolytic solution, the concentration of hydrogen ions is leaning to strong acid, and therefore layers other than Al and AlSi layers peel off due to erosion (for example, a ZnO layer peels off) and peeling off occurs at the interface between the metal layers. Since the peeling off caused by such erosion depends on the concentration of hydrogen ions, the adjustment of hydrogen ions is effective as a means for restraining the erosion.

Such adjustment allows the electrical resistance of a defect portion to increase and thus a leakage current flow is prevented. Thereby, the characteristics of the photovoltaic element, particularly photovoltage generation characteristics under a low illuminance are improved.

The invention has been completed based on the above knowledge. The method of producing a photovoltaic element according to the present invention comprises a step of immersing a photovoltaic element having at least a first electrode layer, a semiconductor layer and a second electrode layer formed on a substrate into an electrolytic solution, and removing a short-circuit current path caused by a defect in the photovoltaic element under the effect of an electric field, wherein the amount of a first ingredient and the amount of a second ingredient in the electrolytic solution is adjusted to control the concentration of hydrogen ions in the electrolytic solution, and the constituent ingredient of the second electrode layer is electrically dissolved by the first ingredient.

When a photovoltaic element comprising a first electrode layer, a semiconductor layer and a second electrode layer formed on a substrate is immersed into an electrolytic solution and a short-circuit current path caused by defects in the photovoltaic element is removed under the effect of an electric field, the peeling off of the first electrode is restrained, the constituent substances dissolved out of the second electrode by reduction reaction is stably taken into the solution so that the constituent substances of the second electrode do not remain on the surface of the defect portion in the photovoltaic element. As a result, it becomes possible to avoid the problems of visual deficiencies caused by the peeling off during the electrolytic treatment and the attachment of metal particles on the surface of the photovoltaic element, and also to improve the photovoltage generation characteristics under a low illuminance.

Also, mixing acid solution and basic solution allows the hydrogen ion concentration to be adjusted. As a result, it is possible to adjust conflicting actions of restraining the first electrode layer (neutral side) from peeling off and taking in the constituent substances of the second electrode (strong acid side). Thereby, it becomes possible to avoid the problems of visual deficiencies caused by the peeling off in the photovoltaic element and the attachment of metal particles on the surface of the element, and to stably produce photovoltaic elements with excellent characteristics of photovoltage generation.

Further, by selecting suitable electrolyte (specifically, the first ingredient) contained in the electrolytic solution depending to the kind of materials of the second electrode layer, it is possible to stably take the constituent substances dissolved from the second electrode layer into the solution by forming a complex and so. As a result, it becomes possible to prevent problems of visual deficiencies caused by residues of the constituent substances of the second electrode layer as metal particles on the surface of the defect portion in the photovoltaic element, and to improve the photovoltage generation characteristics.

Further, by adjusting the hydrogen ion concentration of the electrolytic solution from $1.0 \times 10^{-3.0}$ to $1.0 \times 10^{-1.0}$ mol/l according to the kind of the first electrode layer, the semiconductor layer and the second electrode layer, it becomes possible to avoid the problems of visual deficiencies caused by the peeling off in the photovoltaic element and the attachment of metal particles on the surface of the element, and to stably produce photovoltaic elements with excellent characteristics of photovoltage generation.

Further, by adjusting the electric conductivity of the above electrolytic solution of 10 to 100 mS/cm, the second electrode layer of a defect portion is stably dissolved out. Thereby, it is possible to avoid the visual deficiencies and faulty characteristics caused by the residues of metal particle, and to produce photovoltaic elements with excellent characteristics of photovoltage generation.

Further, by selecting a suitable acid as electrolyte according to the kind of the second electrode layer, the metal ions generated by the reduction of a constituent substance of the second electrode layer and the selected acid stably form a complex salt or a double salt, i.e., take in metal ions. Thereby, it is possible to avoid the visual deficiencies and faulty characteristics caused by metal particle residues due to the metal ions dissolved into the electrolytic solution, and to produce photovoltaic elements with excellent characteristics of photovoltage generation.

Further, by selecting a suitable basic solution, it becomes easy to adjust the concentration of hydrogen ions by delicate neutralization reaction. As a result, it is possible to adjust conflicting actions of restraining the peeling off caused by the erosion of the first electrode layer (neutral side) and taking a constituent material of the second electrode layer into the electrolytic solution (strong acid side). Thereby, the treatment of electric field can be performed at the most favorable point. Therefore, it becomes possible to avoid the problems of visual deficiencies or characteristics caused by the peeling of the photovoltaic element and the attachment of metal particles on the surface of the photovoltaic element, and to stably produce photovoltaic elements with excellent characteristics of photovoltage generation.

Also, by use of the electric field generated by applying bias to the photovoltaic element, electric field conditions variously are selected.

Further, the use of the electric field formed by the photovoltage generated by irradiating the photovoltaic element itself with light does not apply too strong electric field to the photovoltaic element and ensures the action of electric field on the defect portion.

Also, application of bias to the photovoltaic element in a forward direction allows performing the treatment without an adverse effect to the normal portions.

Further, the use of electrically conductive substrate makes it easy to lead out electrodes for the treatment in electrolytic solution, and so the treatment becomes simple for performing it.

Also, the first electrode comprising a plurality of layers including at least one kind of metal layers enhances the effect of reflection in the incidence of light, so that it is possible to produce the photovoltaic element with excellent characteristics.

Further, the semiconductor layer comprising amorphous semiconductor allows producing photovoltaic element with a large area by using roll-to-roll techniques.

Also, the second electrode layer comprising a metal oxide enables a reduction reaction to occur preferentially at the second electrode before at the semiconductor layer and removing an electric short-circuit in the defect portions.

Hereinafter, the preferred embodiments of the present invention will be described with reference to the drawings.

First, the photovoltaic element produced according to the present invention will be described.

Figure 1B:
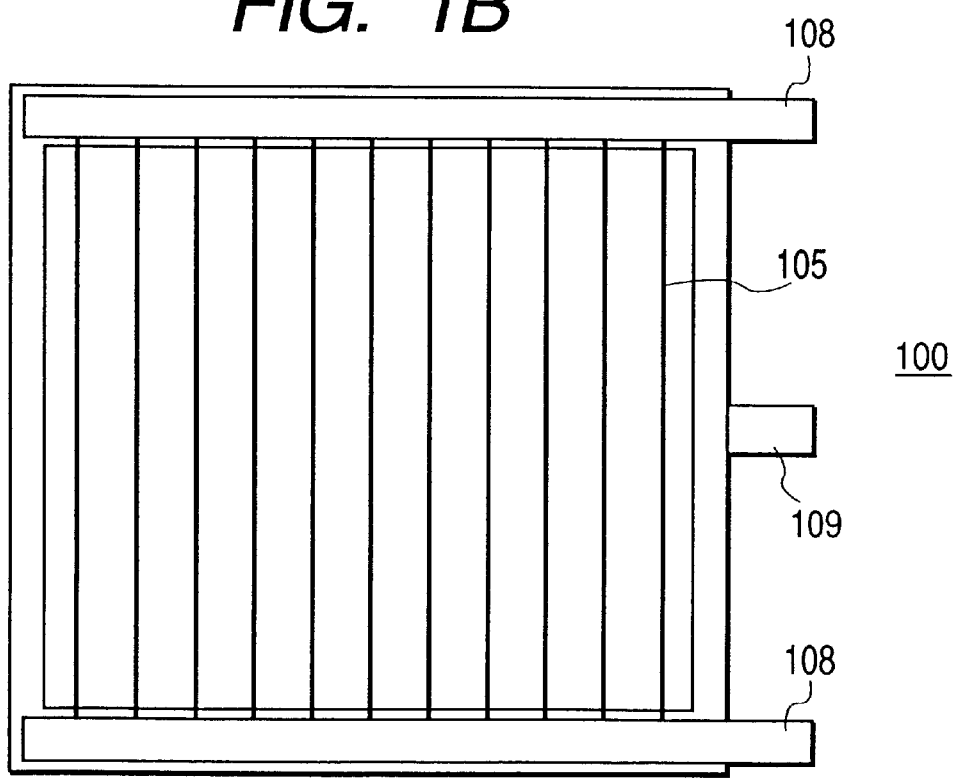

FIGS. 1A and 1B schematically shows one example of a photovoltaic element produced according to the present invention; FIG. 1A shows the cross-sectional view and FIG. 1B shows the plan view.

FIG. 1A and FIG. 1B show a photovoltaic element 100 comprising an amorphous silicon-based semiconductor layer. The photovoltaic element 100 includes a semiconductor layer 110 comprising a plurality of pin junctions 103, 113 and 123 which generate a current flow by absorbing incident light. The figures show a substrate 101 for supporting the body of the photovoltaic element, a first electrode layer 102, a second electrode layer 104 comprising transparent electroconductive film, a grid electrode 105 used as a collector electrode, defect portions 106 such as a pin-hole existing in the photovoltaic element, high-resistance portions 107 removed by reduction reaction, positive electrodes (positive tabs) 108 and a negative electrode (negative tab) 109.

FIGS. 1A and 1B shows an amorphous silicon type photovoltaic element which receives incident light on a side opposite to the substrate. The present invention can be applied to produce such a photovoltaic element, but is not limited to produce a photovoltaic element having such a special structure or shape.

Substrate 101

The substrate 101 mechanically supports a semiconductor layer 110 comprising multilayered thin films of amorphous silicon or the like in a photovoltaic element. In some cases, the substrate 101 is also used as an electrode.

Preferably, the substrate 101 is an electroconductive substrate including a stain-less substrate, a metal member such as a metal foil of tin and a structure composed of electro-conductive layers deposited on at least a part of glass or synthetic polymer resin member.

First Electrode Layer 102

The first electrode layer 102 is one electrode for taking out the electric power generated in the semiconductor layer 110 and is required to have the work function enabling to form an ohmic contact to the semiconductor layer 110. The first electrode preferably has a texture-shaped structure to irregularly reflect an incident light for improving current generation characteristics.

Preferably, a metal or alloy including Al, Ag, Pt, ZnO, $In_2O_3$, ITO, AlSi and transparent electroconductive oxide (TCO) are used as the material for the first electrode. The method of making the first electrode layer includes plating, evaporation and sputtering.

Herein, it is important for improving the characteristics of the photovoltaic element that the first electrode layer includes a metal layer comprising a metal or alloy having a high conductivity and a high reflectance. Further, the first electrode layer is preferably composed of a plurality of layers including at least one kind of metal layer. For example, the first electrode layer is formed such that a metal layer and a transparent electroconductive oxide layer are sequentially stacked on the substrate 101. Thereby, alloy is formed at the interface between the metal layers and the semiconductor layer 110, so that the problem of high series-resistance can be avoided.

Semiconductor Layer 110

As an example of the semiconductor layer 110, an amorphous silicon type photovoltaic element can be mentioned. An i-type semiconductor layer comprises semiconductor materials such as amorphous Si, amorphous SiGe and amorphous SiC, so-called the Group IV element and the Group IV alloy type amorphous semiconductors. A p-type or n-type semiconductor layer comprises semiconductor materials which are produced by doping a valence-electron controlling agent into the above described semiconductor materials used for forming the i-type layer. The compound containing the III family elements is employed as a valence-electron controlling agent to obtain a p-type semiconductor. B, Al, Ga and In can be mentioned as the Group III elements. The compound containing the Group V elements is employed as a valence-electron controlling agent to obtain an n-type semiconductor. P, N, As and Sb can be mentioned as the Group V elements.

For forming the amorphous silicon semiconductor layer, the following well-known techniques can be used as desired; evaporation, sputtering, RF plasma, microwave plasma CVD, ECR, thermal CVD, LPCVD. To produce a large area film layer, the roll-to-roll technique is used wherein film deposition is performed while continuously transferring a substrate.

The present invention can be applied to a structure comprising a single and a plurality of semiconductor junctions (pin junction or pn junction), so-called a tandem cell or triple cell shown in FIGS. 1A and 1B for improving spectral sensitivity and voltage.

Second Electrode Layer 104

The second electrode layer 104 is an electrode for taking out the electromotive force generated in the semiconductor layer 110 and pairs off with the first electrode layer 102.

The second electrode layer 104 is necessary for a photovoltaic element which includes a semiconductor layer having a high sheet resistance, such as an amorphous silicon type photovoltaic element. Further, since the second electrode layer 104 is placed on the incident light side, it is necessary to be transparent, and so sometimes called a transparent electrode. The second electrode layer 104 preferably has an optical transmittance of 85% or more for efficiently absorbing light from the sun, a fluorescent lamp and so on into the semiconductor layer 110. Further, to allow a light generated current to transversely flow to the semiconductor layer 110, its sheet resistance is preferably 100 $\Omega/\square$ or less.

The materials having such properties includes metal oxides such as $SnO_2$, $In_2O_3$, ZnO, CdO, $CdSnO_4$ and ITO (indium tin oxide).

Grid Electrode 105

Grid electrode 105 further collects the current which is generated by semiconductor layer 110 and taken out by the second electrode layer 104.

The grid electrode 105 is formed like a comb, and the width, pitch and the other dimensions of the electrode are designed to be the most suitable from the viewpoint of the sheet resistance value of the second electrode layer 104. The grid electrode 105 is necessary to be of low resistance such that it may not form a series resistor of the photovoltaic element. Concrete methods of forming the grid electrode 105 include a method of screen printing using a paste produced by blending powdered substance of metals such as Ag, Ni, Al, Ti, Cr, W, Cu, a binder of polymer and a solvent, a direct formation method by evaporation, a soldering method, a plating method, and a method of laying a wire-shaped metal as mentioned above.

Defect Portions 106

In the amorphous silicon type photovoltaic element described above, the semiconductor layers 110 deposited is a thin film layer with a total thickness of about 4000 Å. When protrusions and foreign particles exist on/beneath the film, it is difficult to completely coat the protrusions and foreign particles with deposition layers.

For example, in the case of continuously depositing a semiconductor layer 110 on the stainless steel substrate 101, even the treatment for making the surface of the electrode layer 202, a semiconductor layer 203 having a p-type layer as a top layer (corresponding to the left side in FIG. 2A), a second electrode layer 204, a defect portion 205, an electrolyte treatment bath 206, an electrolytic solution 207, a counter electrode 208, a power source 209 and a light irradiation unit 210.

As described above, by changing the second electrode layer 204 on the defect portions 205 into a high resistance portion, the current path to the defect portions 205 is blocked, this formation of the high resistance portions is achieved, for example, by reducing those portions of the second electrode layer 204.

Figure 2A:
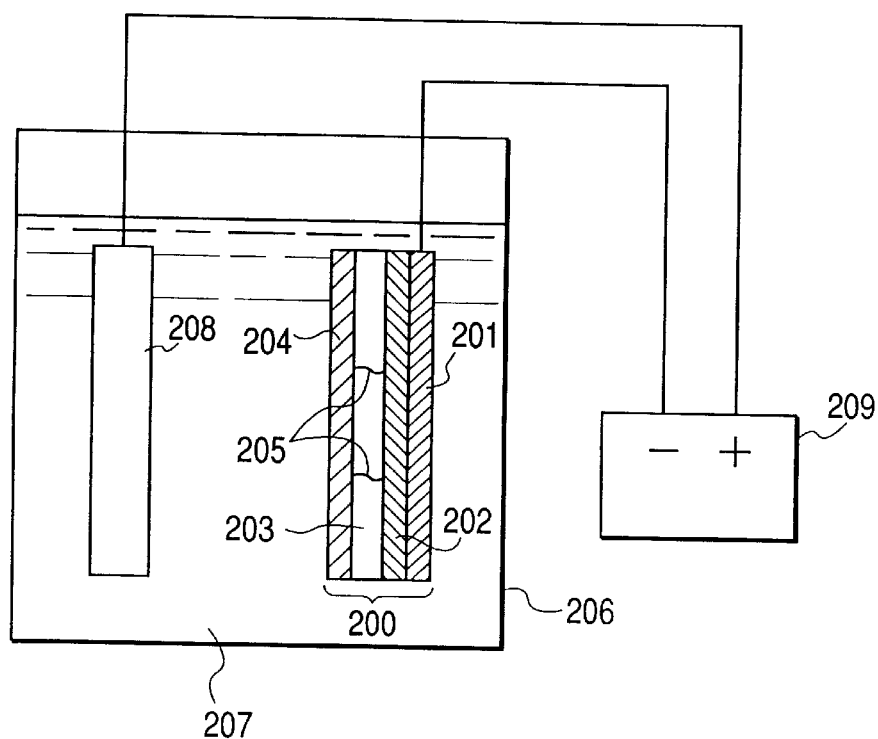
FIGS. 2A and 2B are cross-sectional views for showing one example of the producing apparatus for implementing the present invention.

Referring to FIG. 2A, the photovoltaic element 200 is immersed into the electrolytic solution 207 contained in an electrolytic treatment bath 206, and connected to the negative electrode of the power source 209. The counter electrode 208 is connected to the positive electrode of the power source. That is, the photovoltaic element 200 is adapted to be biased forwardly. When a forward bias voltage is applied between the electrodes, a current preferentially flows through the electrolyte solution 207 as a medium into the defect portion 205 having a low resistivity. At this time, nascent hydrogen (active hydrogen) is produced at the photovoltaic element 200 placed to cathode side. And, the hydrogen chemically reacts with the second electrode layer 204 in the vicinity of the defect portions 205, that is, portions corresponding to the second electrode layer 204 on and above the defect portions 205. Thus, those portions of the second electrode layer 204 of metal oxide are reduced. At the same time, the reaction product yielded by this reduction reaction begins to dissolve into the electrolytic solution and so results in chipping of the second electrode layer 204. Eventually, the current paths of a leakage current transversely flowing through the second electrode layer 204 into the defect portions 205 are cut off.

Figure 2B:
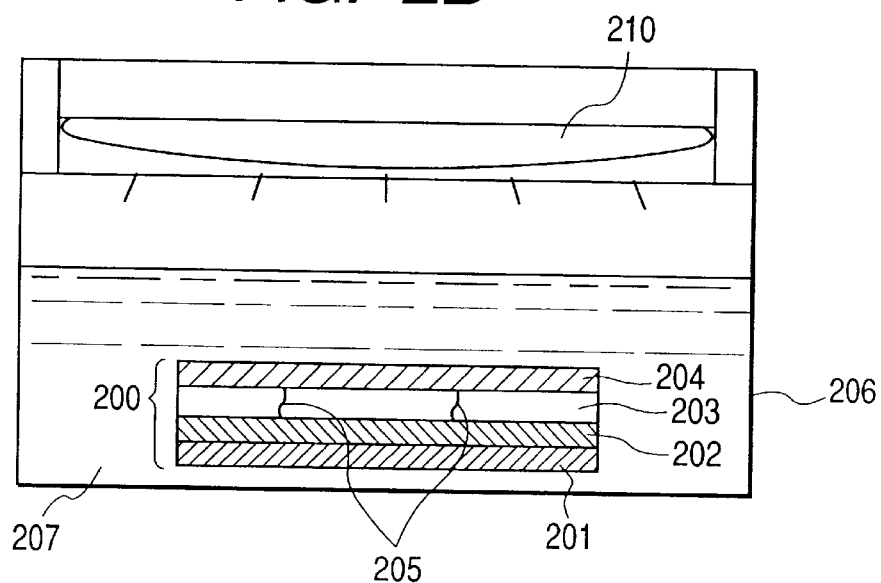

Further, as shown in FIG. 2B, the electric field described above can be generated by irradiating the photovoltaic element in the electrolyte solution with light. In this case, the photovoltage itself of the photovoltaic element generated by light irradiation acts as an applied bias voltage. So, the bias condition can be controlled by the light intensity of irradiation.

A method of producing the photovoltaic element according to the invention comprises mixing a first ingredient and a second ingredient to prepare an electrolytic solution 207, wherein the hydrogen ion concentration is controlled by adjusting the amount of the first ingredient and the amount of the second ingredient, whereby the dissolution of the constituent material of the first electrode layer 202 is restrained and the first ingredient allows the constituent material of the second electrode 204 to be electrically dissolved.

Herein, the first ingredient of the electrolytic solution is not specifically limited as long as it can dissolve the second electrode layer 204. However, the first ingredient is preferably an acid solution and further prefers to contain ions for taking in the material constituting the second electrode layer 204 which is dissolved into the electrolytic solution 207. Concretely, the first ingredient is an acid solution including at least one kind selected from the group consisting of sulfate acid, nitric acid, acetic acid, oxalic acid, phosphoric acid, selenic acid, and salts of these acids. These acid solutions form a complex salt or double salt with metal ions dissolved into the electrolyte solution by reduction reaction to thereby incorporate the metal ions. These are dissolved with stable state in the electrolyte without depositing metal particle.

Further, the second ingredient is not specifically limited as long as it can mix with the first ingredient to adjust the concentration of hydrogen ions in electrolytic solution 207, but it is preferably a basic solution. Concretely, it is a basic solution including at least one kind selected from the group consisting of sodium hydroxide, potassium hydroxide, aluminum hydroxide, magnesium hydroxide, and ammonia.

To effectively prevent the first electrode layer 202 from peeling of, the concentration of hydrogen ions in electrolyte solution 207 is preferably $1.0 \times 10^{-3.0}$ to $1.0 \times 10^{-1.0}$ mol/l, more preferably $1.0 \times 10^{-1.6}$ to $1.0 \times 10^{-1.3}$ mol/l.

Further, the electric conductivity of the electrolyte substrate 101 smooth and flat can not completely eliminate protrusions, pits and deformations from the surface. Also, during the transferring of the substrate 101 in the continuous formation of films, mechanical struck-damages and flaws generate on a surface for depositing a semiconductor layer from the back side of the substrate 101. Thus, protrusions and depressions not less than 1 μm and mechanical damages on the semiconductor layer 110 cause the defect portions 106. For example, when the protrusions on the substrate 101 are too high for the semiconductor layer 110 to coat, the second electrode layer 103 is deposited directly on the protrusions. As a result, the substrate 101 or the first electrode layer 102 directly contact with the second electrode layer 103, and so shunts and short circuits are formed. And, deposition of dust during forming the semiconductor layer 110 eventually results in defect potions where the semiconductor layer 110 is not deposited or peeled off. Thereby, not only pin-holes are formed, but also the second electrode layer 103 is formed directly on the first electrode layer 102 and the substrate 101 to result in shunts and short circuits.

These defects affect photovoltage characteristics under a low illuminance. That is, photocurrent generated in a photovoltaic element linearly increase as illumination increases, but the photovoltage increases exponentially. Thus, when illuminance is strong, extremely under illumination with a brightness of AM-1, the photovoltage generated is nearly equal and independent of the degree of defect. As an illuminance lowers, there appear differences depending on whether defects exist or not. This tendency becomes noticeable under illuminance of 1000 Lux or below. Thus, it becomes important to eliminate the influence of defects when the photovoltaic element is used indoors and in the environment where the sunlight can not suitably be collected.

High Resistance Portions 107

According to the present invention, the high resistance portions 107 are formed at portions of the second electrode layer 104 on defect portions 106 in the semiconductor layer 110 in the photovoltaic element 100, so that the current paths to the defect portions 106 is blocked. Herein, since the second electrode layer 104 only in the vicinity of the defect portions 106 is changed into a high resistance portion, the resistivity itself of the second electrode layer 104 does not increase and so the whole series resistance of the photovoltaic element does not increase.

Hereinafter, the producing method of the present invention will be described.

FIGS. 2A and 2B show schematic cross-sectional views of one example of the producing apparatus for implementing the present invention. FIG. 2A shows the apparatus with an external power source, and FIG. 2B shows the apparatus provided with a light irradiation unit. FIGS. 2A and 2B show a photovoltaic element 200, a substrate 201, a first solution 207 is preferably 10 to 100 mS/cm, more preferably 20 to 70 mS/cm.

Hereinafter, the examples of the present invention will be explained in detail, but the present invention is not limited to these embodiments.

EXAMPLE 1

As an example of the present invention, an pin junction type solar cell 100 having a triple structure as shown in FIGS. 1A and 1B was produced.

First, as the first electrode layer 102, Al and ZnO were deposited to form in sequence an Al layer of 1000 Å and then a ZnO layer of 1 μm were deposited on the substrate 101 of roll-shaped stainless steel 430BA by sputtering. Thereafter, n-type, i-type and p-type layers were deposited in this order in microwave plasma CVD film forming apparatus to form a bottom layer (pin junction) 103, wherein the i-type layer was of amorphous SiGe. Then, n-type, i-type and p-type layers were deposited in this order to form a middle layer (pin junction) 113, wherein the i-type layer was of the amorphous SiGe as in the bottom layer. Then, n-type, i-type and p-type layers were deposited in this order to form a top layer (pin junction) 123, wherein the i-type layer was of amorphous Si. Herein, all of n-type layers and p-type layers were made of a-Si. The i-type layers of the bottom and middle layers are formed by p wave plasma CVD, and other layers are formed by RF plasma CVD. Then, an ITO film layer of 700 Å was deposited as the second electrode layer 104, which is transparent and also have the function of antireflection effect. The photovoltaic element was formed using the above procedures.

Then, the photovoltaic element was cut to pieces of a size of 30 cm×30 cm. After patterning it by well known chemical etching techniques, the photovoltaic element was placed in the electrolytic treatment bath as shown in FIG. 2A. The back side of the photovoltaic element 200, the stainless steel substrate, was connected to the negative electrode of the power source 209, and the counter electrode 208 of a 31 cm square SUS316 was connected to the positive electrode. The electrolyte solution 207 was made by mixing 1% sulfate acid and 8N potassium hydroxide with a ratio of 98:2, wherein the electric conductivity was made to 25.0 mS/cm and the hydrogen ion concentration to $1.0 \times 10^{-1.5}$, and the solution temperature was kept 25.0° C. equal to the room temperature.

As the conditions of the electrolytic treatment, the distance between the electrodes was 4.0 cm, and a pulse voltage of 4.5 volt for 1 second with 0.5 sec interval was applied between the electrodes by 5 pulses. After the electrolytic treatment, the photovoltaic element 200 was taken out, washed and dried. Then, copper wires coated with carbon paste were bonded onto the photovoltaic element to form the grid electrode 105 by a thermal compression-bonding machine. A positive electrode. 108 of a copper foil was connected to the grid electrode 105, and a negative electrode 109 was soldered to the back side of the SUS substrate 101. Thus, the solar cell was completed.

The initial characteristics of these samples were measured as follow.

First, voltage-current characteristics were measured in a dark state, and shunt resistance was calculated from the slope of the voltage-current curve near the point of origin. The average resistance value was 200 kΩ·cm² and so shunt was not generated. Then, the photovoltage generated under various illuminances was measured by using a fluorescent lamp apparatus, and the photovoltage of 1.2 V or more was obtained even under 200 Lux. Further, under the light quantity of 100 mW/cm² from an artificial sun light source (produced by SPIRE Corp.) with AM1.5 Global sun light spectrum, the characteristics of the solar cell were measured, and an excellent conversion efficiency of 9.0%±0.2% was obtained. Further, the active area of the solar cell was observed in detail by a microscope. From the observation result, there is no exposure of the surface of the underlying layers caused by peeling off of the underlying layers from the SUS substrate 101 and the aluminum layer of the first electrode layer 102. Film portions bulging without exposing the underlying layer, just before peeling, were not observed. In this case, the yield was 98%.

Further, these samples were laminated and formed into modules by the well-known technique. And, reliability tests were performed for them according to temperature-humidity cycle test A-2 determined by an environmental test method and endurance test for crystal-based solar cell modules, included in Japan Industrial Standards C8917.

The samples were placed in a constant temperature and constant humidity apparatus which can control temperature and humidity. Temperature cycle test of 20 cycles was performed with a temperature varying from −40° C. to +85° C. (relative humidity of 85%). Then, after the completion of these tests, the measurements using the simulator were performed in the same way as the initial measurement. The average conversion efficiency decreased only by 0.5% with respect to the initial value. Significant deterioration was not observed.

From the results of this Example, it is understood that the photovoltaic element produced according to the present invention have a high yield, excellent characteristics and good appearance, and superior reliability.

COMPARATIVE EXAMPLE

For comparison, the solar cell 100 was produced in the same manner as in Example 1 except for using an aqueous solution composed of only sulfate acid as a conventional electrolyte solution.

Herein, the electrolyte solution was a 1.25% sulfate acid solution, and had a electric conductivity of 55.8 mS/cm and a hydrogen ion concentration of $1.0 \times 10^{-0.8}$ mol/l. The solution temperature was 25.0° C. equal to the room temperature.

In the same manner as in Example 1, the shunt resistance was measured. The average value obtained was 80 kΩcm², and some samples suggested the existence of shunt circuits. The measurement of the photovoltage generated under a low illumlinance showed 0.79 V. This photovoltage value under 200 Lux is lower than that of Example 1. Also, the conversion efficiency obtained was a value of 7.2%±1.8%, which has large variation. Further, observation by a microscope demonstrated a lot of peeled portions with maximum diameter of 1 mm. In samples with low shunt resistance and unfavorable efficiency, peeled portions was observed under the grid electrodes. And further, pin-holes due to the peeling of underlying portions were observed.

Further, these samples were laminated and formed into modules by well known techniques. The reliability test of these modules was performed in the same manner as in Example 1, and a 10% deterioration in conversion efficiency and a 15% reduction in shunt resistance was obtained. From the microscope observation is considered that, by thermal compression of the moisture penetrated from the peeled portions in the first electrode layer 102, the peeling was extended and such degradation took placed.

EXAMPLE 2

The solar cell 100 was produced in the same manner as in Example 1 except for using the mixed solution of nitric acid and magnesium hydroxide as the electrolyte solution.

Herein, the electrolytic solution was made to have a electric conductivity of 40.0 mS/cm and a hydrogen ion concentration of $1.0 \times 10^{-1.7}$ mol/l. The solution temperature was 25.0° C. equal to the room temperature.

As the electrolytic treatment, the distance between the electrodes was 4.0 cm, and a pulse voltage of 5.0 volt for 1.0 second with a 0.5 sec interval was applied between the electrodes by 5 pulses.

The initial characteristics of these samples were measured in the same manner as in Example 1. The photovoltage generated under 200 Lux was 1.21 V on average and the conversion efficiency obtained was a excellent value of 9.0%±0.2%. By the same observation as in Example 1, peeled portions were not found.

EXAMPLE 3

The solar cell 100 was produced in the same manner as in Example 1 except for using the mixture of oxalic acid and aluminum hydroxide as the electrolyte solution.

Herein, the electrolyte solution was made to have a electric conductivity of 35.0 mS/cm and a hydrogen ion concentration of $1.0 \times 10^{-1.8}$ mol/l. The solution temperature was 25.0° C. equal to the room temperature.

As the electrolytic treatment, the distance between electrodes was 4.0 cm, and a pulse voltage of 5.0 volt for 1.0 second with a 0.5 sec interval was applied between the electrodes by 5 pulses.

The initial characteristics of these samples were measured in the same manner as in Example 1. The photovoltage generated under 200 Lux was 1.21 V on average and the conversion efficiency obtained was a excellent value of 9.1%±0.2%. By the same observation-as in Example 1, peeled portions were not found.

EXAMPLE 4

In this Example, the solar cell 100 was produced in the same manner as in Example 1 except for generating an electric field by light irradiation.

The photovoltaic element 200 provided with a pattern was immersed into the same electrolytic solution as used in Example 1 contained in the electrolytic treatment bath 208 as shown in FIG. 2B, with the incident light side (the side of the second electrode layer 204) placed upward. Then, a light irradiation with a light quantity of 100 mW/cm² was performed for 60 seconds on the photovoltaic element from the light irradiation unit 210 comprising a metal-halide lamp. After the electrolytic treatment, the photovoltaic element 200 was taken out, washed and dried. Then, in the same manner as in Example 1, the grid electrode, positive electrode and negative electrode were connected.

The initial characteristics of these samples were measured in the same manner as in Example 1. The photovoltage generated under 200 Lux was 1.22 V on average and the conversion efficiency obtained was a excellent value of 9.0%±0.2%. By the same observation as in Example 1, peeled portions were not found.

EXAMPLE 5

The solar cell 100 was produced in the same manner as in Example 1 except for using the mixture of phosphoric acid and an aqueous solution of ammonia as the electrolyte solution.

Herein, the electrolyte solution was made to have a electric conductivity of 20.5 mS/cm and a hydrogen ion concentration of $1.0 \times 10^{-1.7}$ mol/l. The solution temperature was 25.0° C. equal to the room temperature.

The initial characteristics of these samples were measured in the same manner as in Example 1. The photovoltage generated under 200 Lux was 1.20 V on average and the conversion efficiency obtained was a excellent value of 8.9%±0.3%. By the same observation as in Example 1, peeled portions were not found.

EXAMPLE 6

The solar cell 100 was produced in the same manner as in Example 1 except for using the mixture of selenic acid and sodium hydroxide as the electrolyte solution.

Herein, the electrolyte solution was made to have a electric conductivity of 30.4 mS/cm and a hydrogen ion concentration of $1.0 \times 10^{-1.3}$ mol/l. The solution temperature was 25.0° C. equal to the room temperature.

The initial characteristics of these samples were measured in the same manner as in Example 1. The photovoltage generated under 200 Lux was 1.25 V on average and the conversion efficiency obtained was a excellent value of 9.4%±0.1%. By the same observation as in Example 1, peeled portions were not found.

EXAMPLE 7

The solar cell 100 was produced in the same manner as in Example 1 except for varying the hydrogen ion concentration of the electrolytic solution from $1.0 \times 10^{-3.5}$ to $1.0 \times 10^{-0.8}$ mol/l.

The values of electric conductivity of these electrolyte solutions are listed in Table 1. And, the solution temperature was 25.0° C. equal to the room temperature.

The initial characteristics of these samples were measured in the same manner as in Example 1. The measurement results are listed in Table 1.

From the results of this example, it is understood that the solar cell with excellent conversion efficiency and good appearance can be obtained at the hydrogen ion concentration form $1.0 \times 10^{-3.0}$ to $1.0 \times 10^{-1.0}$ mol/l. It is also understood that the solar cell with especially excellent conversion efficiency can be obtained at the hydrogen ion concentration from $1.0 \times 10^{-1.6}$ to $1.0 \times 10^{-1.3}$ mol/l.

TABLE 1

| Hydrogen ion concentration (mol/l) | Electric conductivity (mS/cm) | Photovoltage under illuminance of 200 Lux (V) | Conversion efficiency (%) | Appearance |
| --- | --- | --- | --- | --- |
| $1.0 \times 10^{-0.8}$ | 55.8 | 0.79 | 7.2 ± 1.8 | peeling, pin-hole exist |
| $1.0 \times 10^{-1.0}$ | 32.5 | 1.19 | 8.9 ± 0.3 | good |
| $1.0 \times 10^{-1.3}$ | 26.5 | 1.22 | 9.2 ± 0.3 | good |
| $1.0 \times 10^{-1.6}$ | 22.5 | 1.21 | 9.0 ± 0.2 | good |
| $1.0 \times 10^{-2.3}$ | 20.2 | 1.18 | 8.8 ± 0.4 | good |
| $1.0 \times 10^{-3.0}$ | 19.3 | 1.10 | 8.5 ± 0.5 | good |
| $1.0 \times 10^{-3.5}$ | 18.7 | 0.72 | 7.0 ± 1.5 | metal particle residues on surface |

The method of producing a photovoltaic element according to the present invention can provide a photovoltaic element which does not have problems of visual deficiency or characteristics caused by peeling off and residues of metal particles, and which is superior in initial characteristics and long-term reliability.

What is claimed is:

1. A method of producing a photovoltaic element comprising the steps of:

immersing a photovoltaic element having at least a first electrode layer, a semiconductor layer and a second electrode layer formed on a substrate into an electrolytic solution, and removing a short circuit current path caused by a defect in the photovoltaic element under an effect of an electric field, wherein an amount of a first ingredient and an amount of a second ingredient in the electrolytic solution is adjusted to control a concentration of hydrogen ions in the electrolytic solution, wherein a constituent substance of the second electrode layer is electrically dissolved by the first ingredient, and wherein the first ingredient is an acid solution and the second ingredient is a basic solution.

2. The method of producing a photovoltaic element according to claim 1, wherein the first ingredient includes ions for dissolving the constituent substance of the second electrode layer into the electrolytic solution.

3. The method of producing a photovoltaic element according to claim 1, wherein the concentration of hydrogen ions contained in the electrolytic solution is $1.0 \times 10^{-3.0}$ to $1.0 \times 10^{-1.0}$ mol/l.

4. The method of producing a photovoltaic element according to claim 1, wherein the electric conductivity of the electrolytic solution is 10 to 100 mS/cm.

5. The method of producing a photovoltaic element according to claim 1, wherein the first ingredient is an acid solution containing at least one selected from the group consisting of sulfate acid, nitric acid, acetic acid, oxalic acid, phosphoric acid, selenic acid and salts of these acids.

6. The method of producing a photovoltaic element according to claim 1, wherein the second ingredient is a basic solution containing at least one selected from the group consisting of sodium hydroxide, potassium hydroxide, aluminum hydroxide, magnesium hydroxide, and ammonia.

7. The method of producing a photovoltaic element according to claim 1, wherein the electric field is an electric field generated by applying a bias to the photovoltaic element.

8. The method of producing a photovoltaic element according to claim 1, wherein the electric field is an electric field generated by a photovoltage generated in the photovoltaic element by irradiating the photovoltaic element with light.

9. The method of producing a photovoltaic element according to claim 7, wherein the bias is applied in a forward direction to the photovoltaic element.

10. The method of producing a photovoltaic element according to claim 1, wherein the substrate is an electroconductive substrate.

11. The method of producing a photovoltaic element according to claim 1, wherein the first electrode layer comprises a plurality of layers including at least one metal layer.

12. The method of producing a photovoltaic element according to claim 1, wherein the semiconductor layer comprises an amorphous semiconductor.

13. The method of producing a photovoltaic element according to claim 1, wherein the second electrode layer comprises a metal oxide.

* * * * *

UNITED STATES PATENT AND TRADEMARK OFFICE
CERTIFICATE OF CORRECTION

PATENT NO.    : 6,221,685 B1
DATED         : April 24, 2001
INVENTOR(S)   : Hirofumi Ichinose et al.

It is certified that error appears in the above-identified patent and that said Letters Patent is hereby corrected as shown below:

Title page,
Item [30], Foreign Application Priority Data, "Mar. 12, 1997" should read
-- Dec. 3, 1997 --.

Column 1,
Line 47, "to" should be deleted.

Column 2,
Line 22, "the" should be deleted;
Line 32, "bring" should read -- bringing --; and
Line 45, "discloses" should read -- disclose --.

Column 3,
Lines 11 and 45, "is" should read -- are --; and
Line 42, "a" should read -- an --, and "take" should read -- takes --.

Column 4,
Lines 2, 53 and 66, "is" should read -- are --;
Line 7, "peeling" should read -- peel --;
Line 9, "exists." should read -- exist --; and
Line 26, "sufficient" should read -- sufficiently --;

Column 5,
Line 21, "to" should read -- on --;
Line 24, "complex and so." should read -- complex. --.

Column 6,
Line 30, "before" should read -- before occurring --;
Lines 36 and 53, "shows" should read -- show --;
Line 64, "cases,the" should read -- cases, the --; and
Line 66, "stain-less" should read -- stainless --.

Column 8,
Line 14, "includes" should read -- include --;
Line 39, "layers" should read -- layer --;
Line 46, "the electrode" should read -- the substrate 101 smooth and flat can not completely eliminate protrusions, pits and deformations from the surface. Also, during the transferring of the substrate 101 in the continuous formation of films, mechanical struck-damages and flaws generate on a surface for depositing a semiconductor layer from the back side of the substrate 101. Thus, protrusions and depressions not less than 1 $\mu$m and mechanical damages on the semiconductor layer 110 cause the defect portions 106.

UNITED STATES PATENT AND TRADEMARK OFFICE
CERTIFICATE OF CORRECTION

PATENT NO. : 6,221,685 B1
DATED : April 24, 2001
INVENTOR(S) : Hirofumi Ichinose et al.

It is certified that error appears in the above-identified patent and that said Letters Patent is hereby corrected as shown below:

For example, when the protrusions on the substrate 101 are too high for the semiconductor layer 110 to coat, the second electrode layer 103 is deposited directly on the protrusions. As a result, the substrate 101 or the first electrode layer 102 directly contact with the second electrode layer 103, and so shunts and short circuits are formed. And, deposition of dust during forming the semiconductor layer 110 eventually results in defect portions where the semiconductor layer 110 is not deposited or peeled off. Thereby, not only pin-holes are formed, but also the second electrode layer 103 is formed directly on the first electrode layer 102 and the substrate 101 to result in shunts and short circuits.

These defects affect photovoltage characteristics under a low illuminance. That is, photocurrents generated in a photovoltaic element linearly increase as illumination increases, but the photovoltage increases exponentially. Thus, when illuminance is strong, extremely under illumination with a brightness of AM-1, the photovoltage generated is nearly equal and independent of the degree of defect. As an illuminance lowers, there appear differences depending on whether defects exist or not. This tendency becomes noticeable under illuminance of 1000 Lux or below. Thus, it becomes important to eliminate the influence of defects when the photovoltaic element is used indoors and in the environment where the sunlight can not suitably be collected.

(High resistance portions 107)

According to the present invention, the high resistance portions 107 are formed at portions of the second electrode layer 104 on defect portions 106 in the semiconductor layer 110 in the photovoltaic element 100, so that the current paths to the defect portions 106 are blocked. Herein, since the second electrode layer 104 only in the vicinity of the defect portions 106 is changed into a high resistance portion, the resistivity itself of the second electrode layer 104 does not increase and so the whole series resistance of the photovoltaic element does not increase.

Hereinafter, the producing method of the present invention will be described.

Figs. 2A and 2B show schematic cross-sectional views of one example of the producing apparatus for implementing the present invention. Fig. 2A shows the apparatus with an external power source, and Fig. 2B shows the apparatus provided with a light irradiation unit. Figs. 2A and 2B show a photovoltaic element 200, a substrate 201, a first electrode --.

UNITED STATES PATENT AND TRADEMARK OFFICE
CERTIFICATE OF CORRECTION

PATENT NO. : 6,221,685 B1
DATED : April 24, 2001
INVENTOR(S) : Hirofumi Ichinose et al.

It is certified that error appears in the above-identified patent and that said Letters Patent is hereby corrected as shown below:

Column 9,
Line 56, "of," should read -- off, --;
Line 60, "sub-" should be deleted;
Lines 61-67, should be deleted.

Column 10,
Lines 1-47, should be deleted;
Line 48, "a photovoltaic element 200, a substrate 201, a first" should be deleted; and
Line 57, "an pin" should read -- a pin --.

Column 11,
Line 7, "p" should read -- $\mu$ --;
Line 10, "have" should read -- has --;
Line 35, "electrode." should read -- electrode --; and
Line 40, "follow." should read -- follows. --.

Column 12,
Lines 22 and 65, "a" should read -- an --;
Line 30, "illumlinance" should read -- illuminance --;
Line 36, "was" should read -- were --; and
Line 47, "placed." should read -- place. --.

Column 13,
Lines 5, 17, 40, 50, 57 and 65, "a" should read -- an --;
Line 18, "observation-as" should read -- observation as --.

UNITED STATES PATENT AND TRADEMARK OFFICE
CERTIFICATE OF CORRECTION

PATENT NO. : 6,221,685 B1
DATED : April 24, 2001
INVENTOR(S) : Hirofumi Ichinose et al.

It is certified that error appears in the above-identified patent and that said Letters Patent is hereby corrected as shown below:

Column 14,
Line 6, "a" should read -- an --;
Line 12, "1.0 x 10⁻" should read -- $1.0 \times 10^{-0.8}$ --;
Line 13, "0.8 mol/l." should read -- mol/l. --; and
Line 23, "form" should read -- from --.

Signed and Sealed this

Eighteenth Day of February, 2003

JAMES E. ROGAN
*Director of the United States Patent and Trademark Office*